US008407059B2

(12) United States Patent
Cho

(10) Patent No.: US 8,407,059 B2
(45) Date of Patent: Mar. 26, 2013

(54) METHOD AND APPARATUS OF AUDIO MATRIX ENCODING/DECODING

(75) Inventor: Sung-ho Cho, Hwaseong-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 765 days.

(21) Appl. No.: 12/137,741

(22) Filed: Jun. 12, 2008

(65) Prior Publication Data

US 2009/0164225 A1 Jun. 25, 2009

(30) Foreign Application Priority Data

Dec. 21, 2007 (KR) ................................ 2007-135243

(51) Int. Cl.

| | |
|---|---|
| ***G10L 19/00*** | (2006.01) |
| *G06F 15/00* | (2006.01) |
| *G10L 19/14* | (2006.01) |
| *G10L 21/02* | (2006.01) |
| *H04R 5/00* | (2006.01) |
| *H04R 5/02* | (2006.01) |
| *H03G 3/00* | (2006.01) |
| *H03G 7/00* | (2006.01) |
| *H04H 20/28* | (2008.01) |

(52) U.S. Cl. ...................... 704/500; 704/200.1; 704/205; 704/501; 704/228; 704/200; 381/61; 381/23; 381/302; 381/104; 381/106; 370/487

(58) Field of Classification Search .................. 704/500; 381/61, 305

See application file for complete search history.

(56) References Cited

U.S. PATENT DOCUMENTS

| | | | | |
|---|---|---|---|---|
| 4,799,260 | A | 1/1989 | Mandell et al. | |
| 5,909,664 | A * | 6/1999 | Davis et al. | 704/200.1 |
| 6,639,989 | B1 * | 10/2003 | Zacharov et al. | 381/303 |
| 6,931,370 | B1 * | 8/2005 | McDowell | 704/200.1 |
| 7,107,211 | B2 * | 9/2006 | Griesinger | 704/228 |
| 7,292,697 | B2 * | 11/2007 | Tatsuta et al. | 381/302 |
| 8,078,474 | B2 * | 12/2011 | Vos et al. | 704/500 |
| 8,090,120 | B2 * | 1/2012 | Seefeldt | 381/104 |
| 8,194,861 | B2 * | 6/2012 | Henn et al. | 381/22 |
| 8,295,493 | B2 * | 10/2012 | Faller | 381/1 |
| 2003/0031333 | A1 * | 2/2003 | Cohen et al. | 381/303 |
| 2007/0064957 | A1 * | 3/2007 | Pages | 381/61 |
| 2007/0297455 | A1 * | 12/2007 | McParland | 370/487 |

FOREIGN PATENT DOCUMENTS

| | | |
|---|---|---|
| KR | 2006-132867 | 12/2006 |
| KR | 10-666019 | 1/2007 |
| WO | 02-19768 | 3/2002 |

* cited by examiner

*Primary Examiner* — Pierre-Louis Desir
*Assistant Examiner* — Neeraj Sharma
(74) *Attorney, Agent, or Firm* — Stanzione & Kim, LLP

(57) ABSTRACT

A method to audio matrix encode/decode, which encode and decode audio signals of two or more channels into an audio signal of one or more channel while preserving the direction of a sound image includes extracting pieces of sound image information from audio signals of multi channels, encoding and allocating the extracted sound image information to an inaudible frequency domain except an audible frequency domain, and adding the sound image information allocated to the inaudible frequency domain and matrix-encoded stereo signals of the audible frequency domain.

25 Claims, 10 Drawing Sheets

FIG. 1 (CONVENTIONAL)
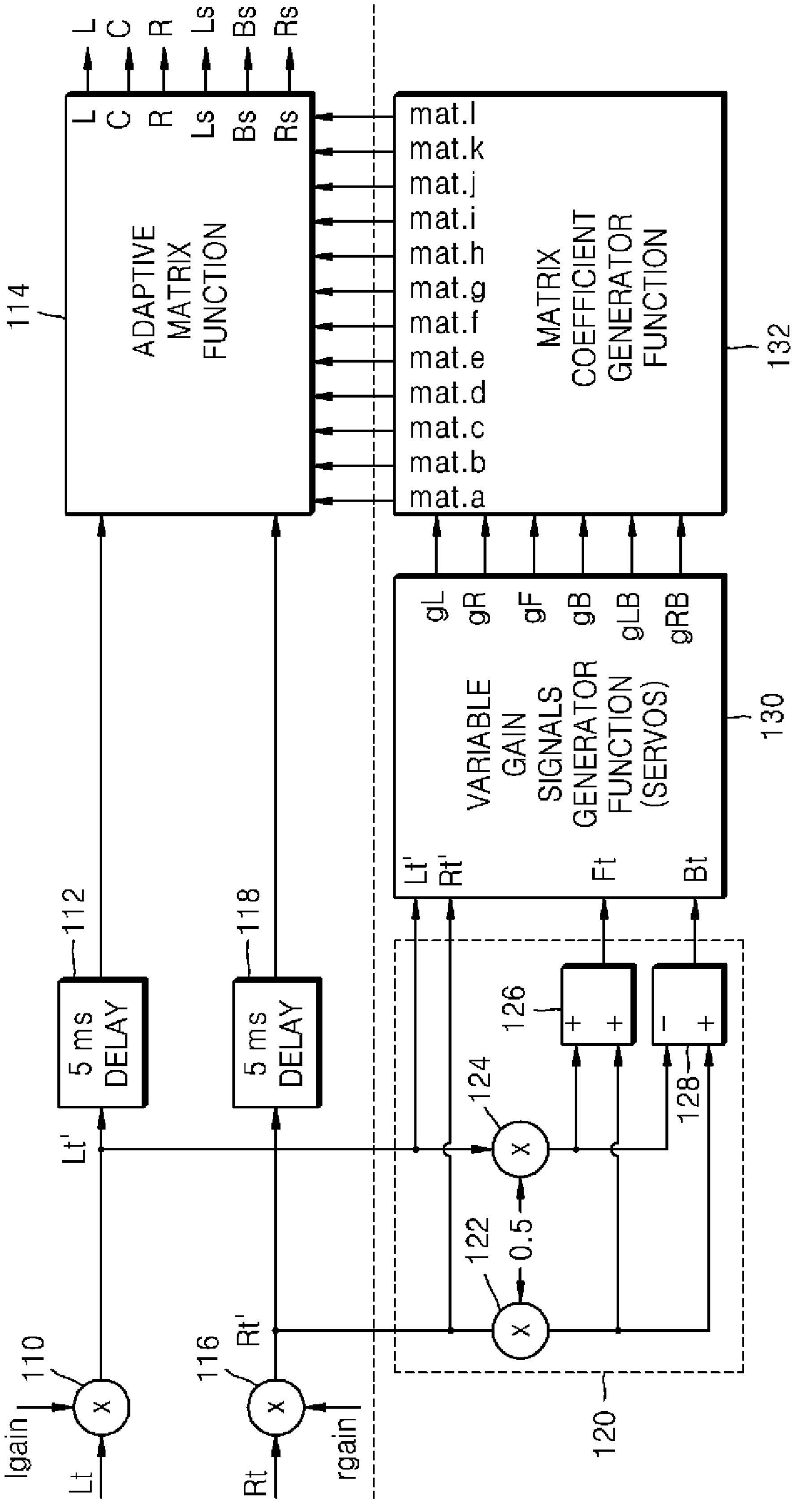

METHOD AND APPARATUS OF AUDIO MATRIX ENCODING/DECODING

CROSS-REFERENCE TO RELATED APPLICATIONS

This application claims priority under 35 U.S.C. §119(a) from Korean Patent Application No. 10-2007-00135243, filed on Dec. 21, 2007 in the Korean Intellectual Property Office, the disclosure of which is incorporated herein in its entirety by reference.

BACKGROUND OF THE INVENTION

1. Field of the Invention

The present general inventive concept relates to an audio reproducing system, and more particularly, to a method and apparatus to audio matrix encode/decode, which encode and decode audio signals of two or more channels into an audio signal of one or more channel while preserving a direction of a sound image.

2. Description of the Related Art

While viewers, conventionally, could watch movies or programs through terrestrial television broadcasting, recent distribution of video tapes, video discs, and satellite broadcasting allows the viewers to enjoy original sound of the programs the viewers are watching. For such the original sound that is available by the video tapes, video discs, and satellite broadcasting, audio signals of a plurality of channels are encoded into audio signals of two channels by performing matrix process. The audio signals of two channels which are encoded by the matrix process can be reproduced as stereo sounds. Also, by using a particular decoder, audio signals of five channels including a front left channel L, a center channel C, a front right channel R, a left surround channel Ls, and a right surround channel Rs can be restored from audio signals of two channels. From among the audio signals of five channels, the center channel signal functions to achieve localization of the sound, which is involved with an articulation of the sound and the surround channel signals function to increase a realistic impression of the sound by moving sounds, surround sounds, and reverberation sounds.

The conventional matrix decoder creates a center channel signal and surround channel signals using addition and subtraction of signals of two channels. An audio matrix in which matrix characteristics are most changed is known as a passive matrix decoder. In each channel signal separated by the passive matrix decoder, when encoding is performed, other channel audio signals are scaled down and linearly combined together. Thus, the signals of channels output by the conventional passive matrix decoder has low channel separation, and thus the localization of the sound image is not precisely defined. An active matrix decoder adaptively alters matrix characteristics in order to increase the separation of two-channel matrix-encode signals.

U.S. Pat. No. 4,799,260 (filed on 6 Feb. 1986 entitled "Variable Matrix Decoder") and WO 02/19768 A2 (filed on 31 Aug. 2000 entitled "Method for Apparatus for Audio Matrix Decoding), relates to a matrix decoder.

FIG. 1 is a block diagram illustrating a matrix decoder according to the conventional art. Referring to FIG. 1, in the conventional matrix decoder, gain functions 110 and 116 clip input signals in order to keep balance between levels of stereo signals $L_t$ and $R_t$. A passive matrix function 120 outputs passive matrix signals from stereo signals L't and R't output from the gain functions 110 and 116. A variable gain signal generator function 130 generates six control signals gL, gR, gF, gB, gLB, and gRB in response to the passive matrix signals generated by the passive matrix function 120. A matrix coefficient generator function 132 generates twelve matrix coefficients in response to the six control signals generated by the variable gain signal generator function 130. An adaptive matrix function 114 generates output signals L, C, R, Ls, Bs, and Rs in response to the input stereo signals L't and R't and the matrix coefficient generated by the matrix coefficient generator function 132. The variable gain signal generator function 130 monitors the level of the signal of each channel, and calculates optimum linear coefficient according to the monitored level of the signal of each channel in order to reconstruct audio signals of multi channels. The matrix coefficient generator function 132 increases the level of the channel, which has the greatest level, in nonlinear fashion.

However, the conventional matrix decoding system as in FIG. 1 has a difficulty to accurately represent the changes in location of a sound source that moves in a virtual space, thereby, disadvantageously, unable to represent the sound image dynamically. That is, most of reproduced sound energies are output mainly from the front channels (L, R, and C channels), and hence, when signals that have already been down-mixed are up-mixed again, the channel separation of the signals is reduced and movement of the sound image cannot be satisfactorily restored.

SUMMARY OF THE INVENTION

The present general inventive concept provides a method and apparatus to audio matrix encode/decode, which can effectively restore movement of a sound image and enhance channel separation by allocating sound image information within an audible frequency domain to an inaudible frequency domain as side information.

Additional aspects and utilities of the present general inventive concept will be set forth in part in the description which follows and, in part, will be obvious from the description, or may be learned by practice of the general inventive concept.

The foregoing and/or other aspects and utilities of the general inventive concept may be achieved by providing an audio matrix encoding method including extracting pieces of sound image information from audio signals of multi channels, encoding and allocating the extracted sound image information to an inaudible frequency domain except an audible frequency domain, and adding the sound image information allocated to the inaudible frequency domain and matrix-encoded stereo signals of the audible frequency domain.

The foregoing and/or other aspects and utilities of the general inventive concept may also be achieved by providing an audio matrix decoding method including separating sound image information of an inaudible frequency domain and stereo signals of an audible frequency domain from an audio signal, decoding signals of multi channels from the stereo signals of the audible frequency domain, decoding the sound image information from the inaudible frequency domain, and reallocating a power of a signal to a location of a speaker of each of the multi channel signals based on the decoded sound image information.

The foregoing and/or other aspects and utilities of the general inventive concept may also be achieved by providing an audio matrix encoding apparatus including a sound image information extracting unit to extract pieces of sound image information corresponding to an intensity and a location of individual virtual sound sources, which exists between every two adjacent channels, based on power vectors of audio signals of a plurality of channels, a sound image information encoder to encode the sound image information extracted by the sound image extracting unit and allocates the encoded sound image information to an inaudible frequency domain except an audible frequency domain, a passive matrix encoder to encode the audio signals of the plurality of channels into signals of stereo channels by performing a matrix process, and an adder to add the sound image information, which is encoded by the sound image information encoder, and the audio signals of two channels, which are encoded by the passive matrix encoder.

The foregoing and/or other aspects and utilities of the general inventive concept may also be achieved by providing an audio matrix decoding apparatus including a signal dividing unit to divide stereo channel signals into an inaudible frequency domain and an audible frequency domain by filtering the stereo channel signals, a passive matrix decoder to decode the stereo signals of the audible frequency domain, which is divided by the signal dividing unit, into signals of a plurality of channels, a sound image information decoder to decode sound image information from the inaudible frequency domain, which is divided by the signal dividing unit, and a channel power enhancer to reallocate a power of each signal of the plurality of channels, which is decoded by the passive matrix decoder, based on the sound image information decoded by the sound image information decoder.

The foregoing and/or other aspects and utilities of the general inventive concept may also be achieved by providing an encoder apparatus including an audio encoder to encode audio signals of two or more channels into an audio signal of one or more channels, and to allocate sound image information within an audible frequency domain to an inaudible frequency domain as side information, wherein movement of a sound image is restored and channel separation is enhanced.

The side information may correspond to a location and an intensity of a virtual sound source allocated to a frequency domain other than the inaudible frequency domain.

The sound source may be divided into a plurality of subbands.

The foregoing and/or other aspects and utilities of the general inventive concept may also be achieved by providing an encoding method including encoding audio signals of two or more channels into an audio signal of one or more channels, and allocating sound image information within an audible frequency domain to an inaudible frequency domain as side information such that movement of a sound image is restored and channel separation is enhanced.

The foregoing and/or other aspects and utilities of the general inventive concept may also be achieved by providing a computer-readable recording medium having embodied thereon a computer program to execute a method, wherein the method including encoding audio signals of two or more channels into an audio signal of one or more channels, and allocating sound image information within an audible frequency domain to an inaudible frequency domain as side information such that movement of a sound image is restored and channel separation is enhanced.

BRIEF DESCRIPTION OF THE DRAWINGS

The above and other features and utilities of the present general inventive concept will become more apparent by describing in detail exemplary embodiments thereof with reference to the attached drawings in which:

FIG. 1 is a block diagram illustrating a matrix decoder according to the conventional art;

DETAILED DESCRIPTION OF THE PREFERRED EMBODIMENTS

Figure 2:
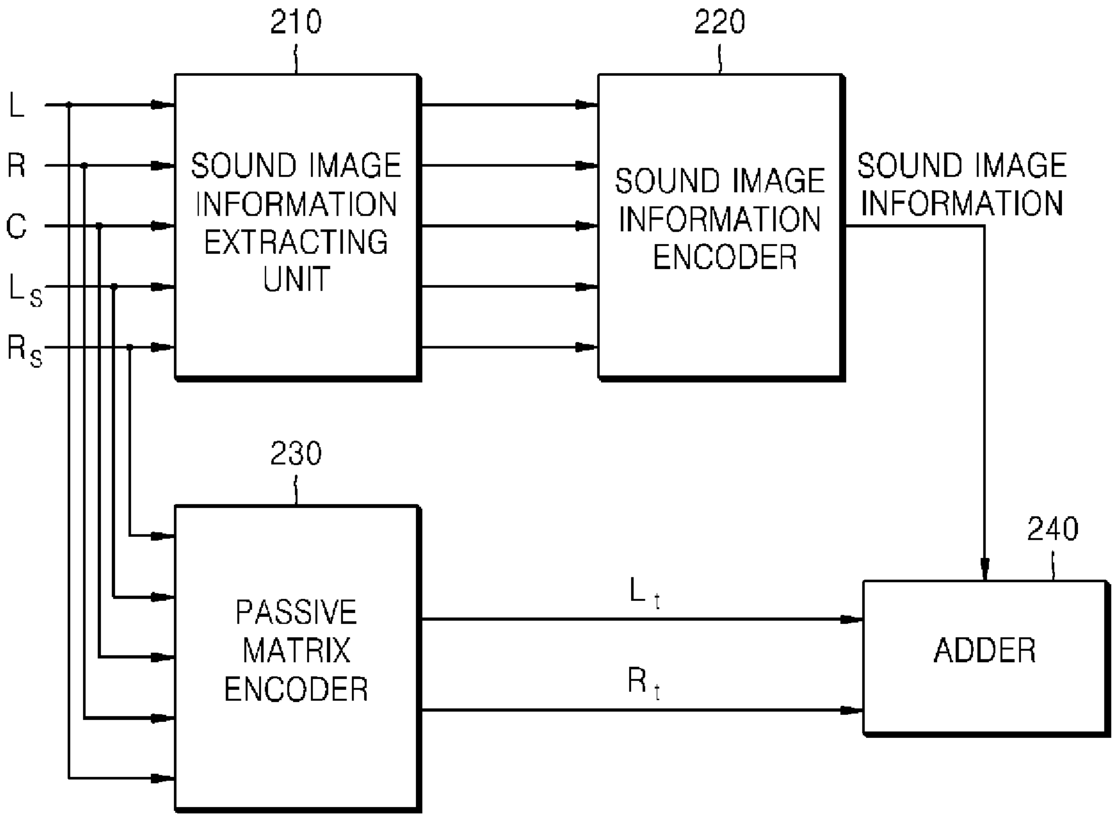
FIG. 2 is a block diagram illustrating an audio matrix encoding apparatus according to an embodiment of the present general inventive concept.

Reference will now be made in detail to embodiments of the present general inventive concept, examples of which are illustrated in the accompanying drawings, wherein like reference numerals refer to the like elements throughout. The embodiments are described below in order to explain the present general inventive concept by referring to the figures.

FIG. 2 is a block diagram illustrating an audio matrix encoding apparatus according to an embodiment of the present general inventive concept. Referring to FIG. 2, the audio matrix encoding apparatus includes a sound image information extracting unit 210, a sound image information encoder 220, a passive matrix encoder 230, and an adder 240.

A left channel signal L, a center channel signal C, a right channel signal R, a left surround channel signal Ls, a right surround channel signal Rs and the like are input to the sound image extracting unit 210.

The sound image information extracting unit 210 extracts an intensity and position of a virtual sound source, which exists between each channel, based on a power vector of each channel audio signal.

The sound image information encoder 220 encodes the sound image information extracted by the sound image information extracting unit 210 into a component and an amplitude of a particular frequency of an inaudible frequency domain, and the encoded sound image information is allocated to an inaudible frequency domain other than an audible frequency domain. The inaudible frequency domain may be between 0 to 20 Hz.

The passive matrix encoder 230 encodes audio signals of multi-channels into signals of two channels $L_t$ and $R_t$ by performing matrix process.

The adder 240 adds up the audio signals of two channels $L_t$ and $R_t$, which have been encoded by the passive matrix encoder, 230 and the sound image information encoded by the sound image information encoder 220.

The adder 240 outputs stereo signals $L_t$* and $R_t$*, which are obtained by adding the audio signals of an audible frequency domain and the sound image information of an inaudible frequency domain.

Figure 3A:
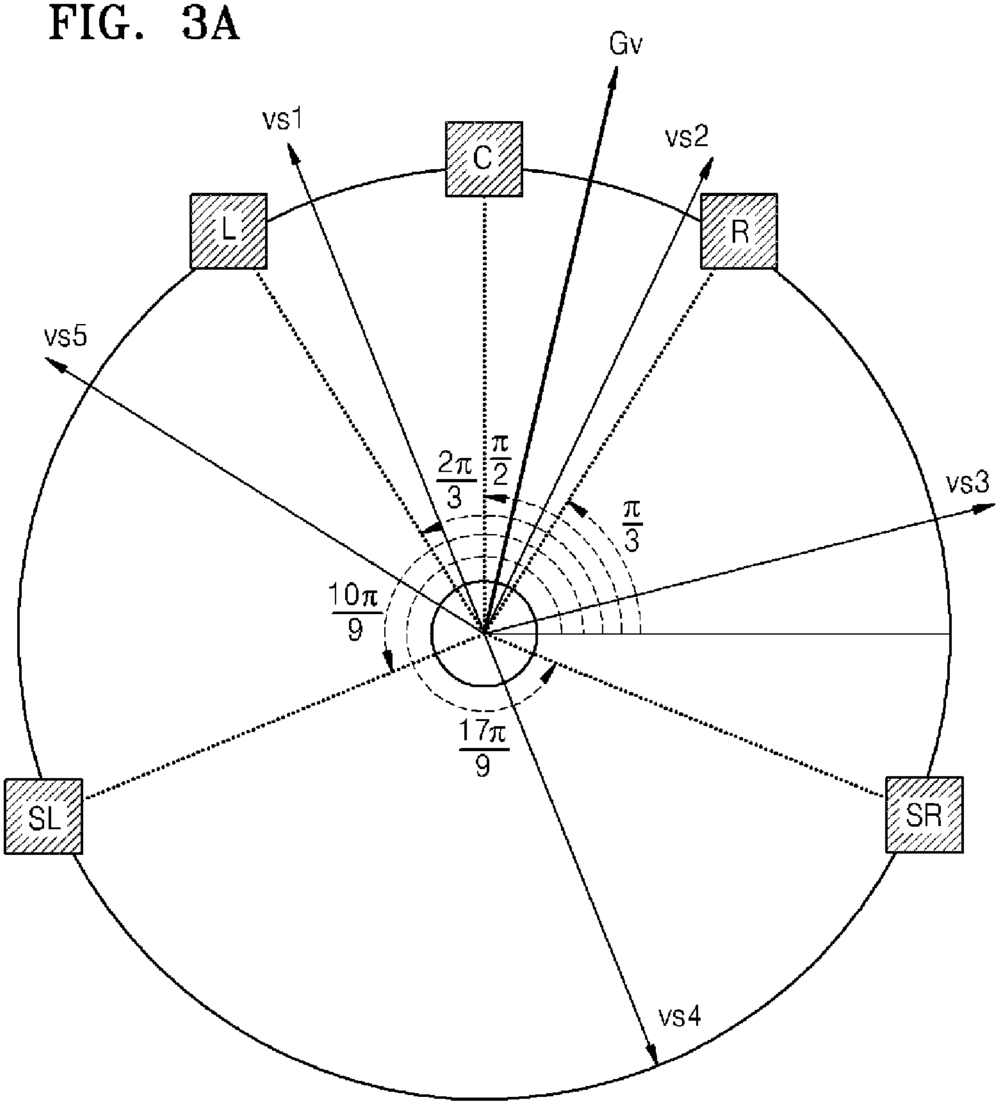
FIG. 3A illustrates locations of channel speakers and virtual sound sources.

FIG. 3A illustrates locations of channel speakers and virtual sound sources. Referring to FIG. 3A, the locations of speakers L, C, R, SL, and SR of a left channel, a center channel, a right channel, a left surround channel, and a right surround channel are expressed in polar coordinates. Furthermore, the virtual sound source vectors vs1, vs2, vs3, vs4, or vs5 is present between every two adjacent channel speakers L, C, R, SL and SR. A global power vector Gv represents a location of a most dominant sound image among the entire sound images.

Figure 3B:
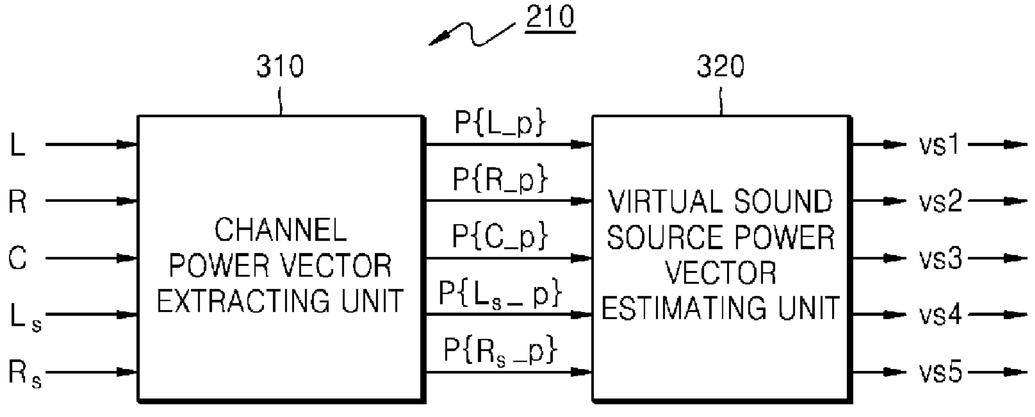
FIG. 3B is an embodiment of the sound image information extracting unit in FIG. 2.

FIG. 3B is an embodiment of the sound image information extracting unit 210 in FIG. 2. A channel power vector extracting unit 310 extracts power vectors P{L_p}, P{C_p}, P{R_p}, P{SL_p}, and P{SR_p} of five channels by multiplying an amplitude of each channel signal L, C, R, Ls, and Rs by a location value of each speaker in the polar coordinates.

A virtual sound source power vector estimating unit 320 calculates a first, a second, a third, a fourth, and a fifth virtual sound source vector vs1, vs2, vs3, vs4, and vs5 between every two adjacent channel speakers based on the power vector P{L_p}, P{C_p}, P{R_p}, P{SL_p}, and P{SR_p} of each channel which have been extracted by the channel power vector extracting unit 310.

For example, the first virtual sound source vector vs1 is calculated by adding the left channel power vector P{L_p} and the center channel power vector P{C_p}. The second virtual sound source vector vs2 is calculated by adding the center channel power vector P{C_p} and the right channel power vector P{R_p}. The third virtual sound source vector vs3 is calculated by adding the right channel power vector P{R_p} and the right surround channel power vector P{SR_p}. The fourth virtual sound source vector vs4 is calculated by adding the right surround channel power vector P{SR_p} and the left surround channel power vector P{SL_p}. The fifth virtual sound source vector vs5 is calculated by adding the left surround channel power vector P{SL_p} and the left channel power vector P{L_p}.

Each of the first, second, third, fourth, and fifth virtual sound source vectors vs1, vs2, vs3, vs4, and vs5 includes information on a position and an intensity of the virtual sound source. The intensity of the virtual sound source is obtained by squaring the virtual sound source vector, and the location of the virtual sound source is obtained from the vector value of a moving virtual sound source.

Figure 4:
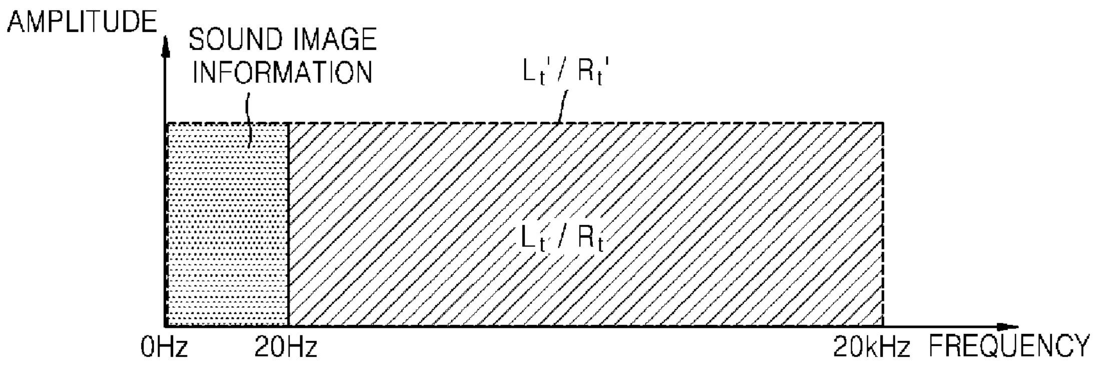
FIG. 4 illustrates a spectrum where sound image information is allocated, according to an embodiment of the present general inventive concept.

FIG. 4 illustrates a spectrum where sound image information is allocated, according to an embodiment of the present general inventive concept. Referring to FIG. 4, in an inaudible frequency domain from 0 to 20 Hz, sound image information corresponding to the intensity and location of the virtual sound source is allocated, and in an audible frequency domain from 21 to 20 kHz, a stereo audio signal $L_t$ and $R_t$ is allocated. According to another embodiment, the sound image information can be allocated to the inaudible frequency domain more than 20 kHz.

Therefore, in the entire frequency domain from 0 to 20 kHz, signals $L_t'$ and $R_t'$ obtained by combining the sound image information with the stereo signals $L_t$ and $R_t$ are allocated.

Figure 5:
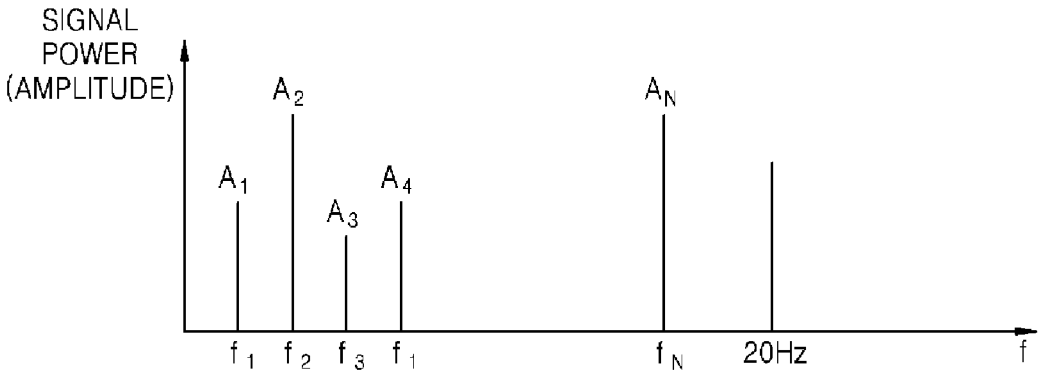
FIG. 5 illustrates a graph in which sound image information is encoded into a spectral line in an inaudible frequency domain in FIG. 4.
Figure 6A:
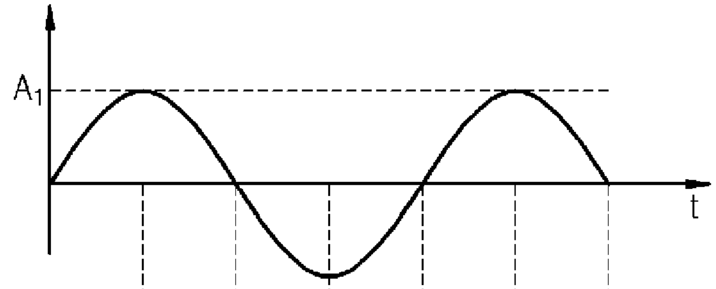
FIGS. 6A-6D illustrates graphs in which the sound image information in FIG. 4 is encoded.
Figure 6B:
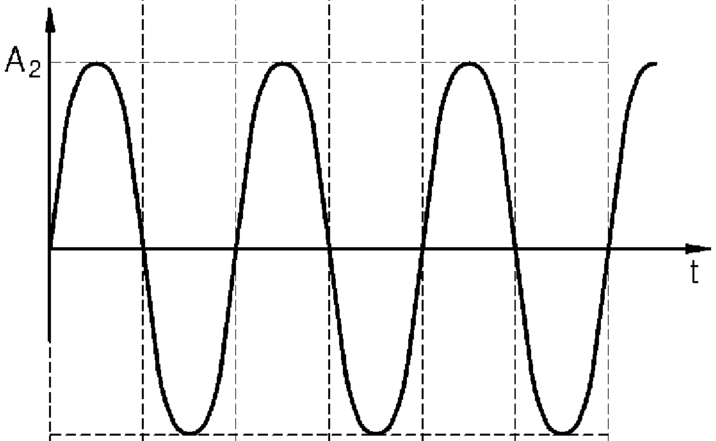
Figure 6C:
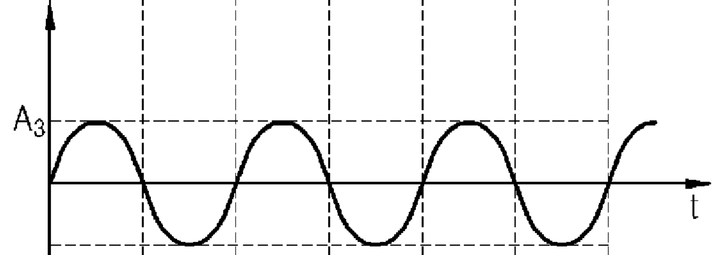
Figure 6D:
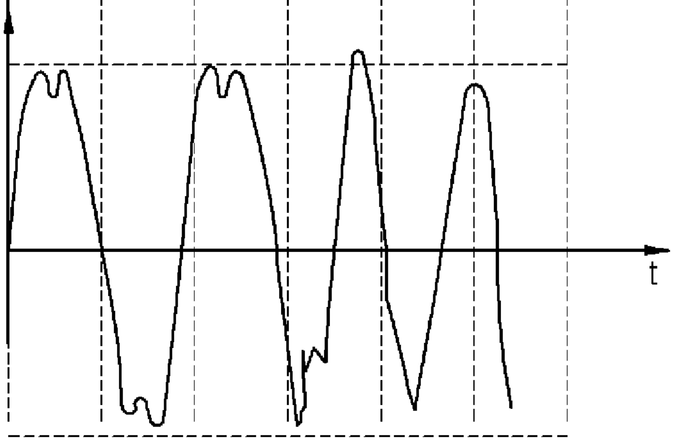

FIG. 5 illustrates a graph in which sound image information is encoded into a spectral line in the inaudible frequency domain in FIG. 4. Referring to FIG. 5, the sound image information is encoded into a spectral line in the inaudible frequency domain from 0 to 20 Hz.

Various methods can be employed to encode the sound image information. For example, frequency components $f_1$, $f_2$, $f_3$, . . . , $f_n$ within a range from 0 to 20 Hz may be allocated to the inaudible frequency domain according to the locations of the sound images, for example, within a range from 0° to 30° (between the channel C and the channel L), a range from 30° to 110° (between the channel L and the channel Ls), a range from −30° to 0° (between the channel C and the channel R), a range from −30° to 0° (between the channel C and the channel R) and a range from −30° to −1100° (between the channel R and the channel Rs). Then, various frequency characteristics can be encoded based on an amplitude of the frequency components.

A representing number of sound image information in the frequency components between 0 to 20 Hz can be represented by Equation 1.

$$N=\{(20/\Delta f)+1\}\times 2ch \qquad \text{Equation 1}$$

Δf is an interval between frequencies.

For example, if the sound image information is used for five channels, eight spectral lines will be used for each channel.

FIGS. 6A-6D illustrates graphs in which the sound image information in FIG. 4 is encoded. Referring to FIGS. 5 and 6A-6D, temporal signals are created based on the spectrum from 0 to 20 Hz. The position and intensity of the virtual sound sources are combined with different amplitudes and frequency components to be encoded into temporal signals. For example, the frequency components $f_1$, $f_2$, $f_3$, . . . , $f_n$ are mapped with the position of the virtual sound source, and the amplitudes $A_1$, $A_2$, $A_3$, $A_{14}$, . . . , $A_n$ are mapped with the intensity of the virtual sound source. Thus, the sound image information is encoded into a temporal signal (d) (see FIG. 6D) by combining a first temporal signal (a) (see FIG. 6A) having the first frequency component $f_1$ and the first amplitude $A_1$, a second temporal signal (b) (see FIG. 6B) having the second frequency component $f_2$ and the second amplitude $A_2$, a third temporal signal (c) (see FIG. 6C) having the third frequency component $f_3$ and the third amplitude $A_3$, and an nth temporal signal having the nth frequency component $F_n$ and the nth amplitude $A_n$.

Figure 7:
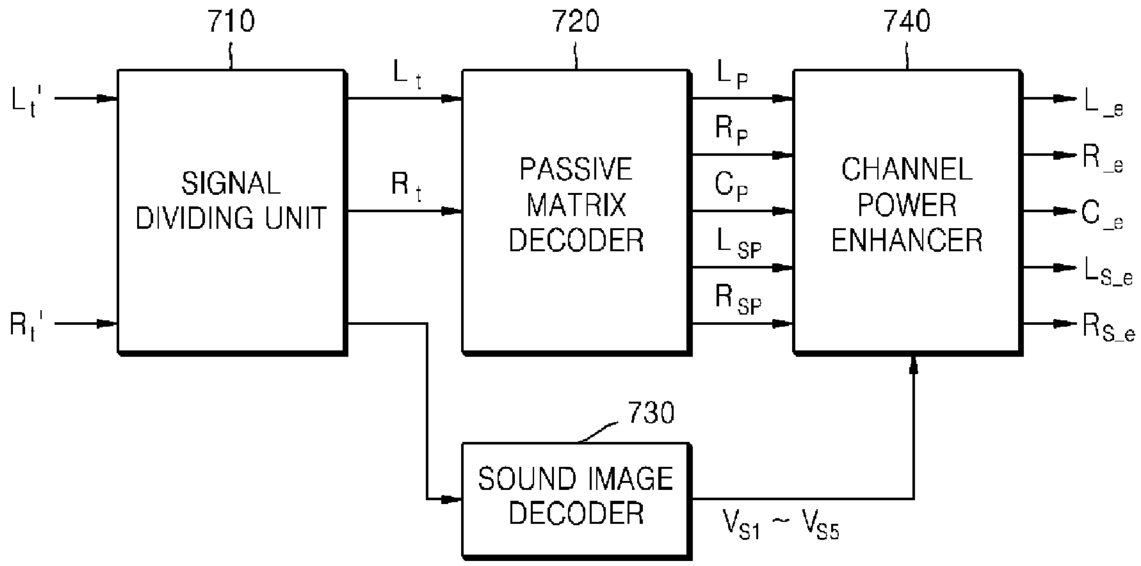
FIG. 7 is a block diagram illustrating an audio matrix decoding apparatus according to an embodiment of the present general inventive concept.

FIG. 7 is a block diagram illustrating an audio matrix decoding apparatus according to an embodiment of the present general inventive concept. Referring to FIG. 7, the audio matrix decoding apparatus includes a signal dividing unit 710, a passive matrix decoder 720, a sound image information decoder 730, and a channel power enhancer 740.

Stereo channel audio signals $L_t'$ and $R_t'$, which include sound image information, are input to the signal dividing unit 710. The signal dividing unit 710 filters the stereo channel audio signals $L_t'$ and $R_t'$ to divide the signals into the inaudible frequency domain of the sound image information, which is encoded into the temporal signal, and the audible frequency domain of the matrix-encoded stereo signals $L_t$ and $R_t$.

The passive matrix decoder 720 decodes the matrix-encoded stereo signals $L_t$ and $R_t$, which are divided from the stereo channel audio signals $L_t'$ and $R_t'$, into a left channel signal Lp, a center channel signal Cp, a right channel signal Rp, a left surround channel signal Lsp, and a right surround channel signal Rsp by linear combination between channels. For example, Lp=Lt, Rp=Rt, $Cp=0.7*(L_t+R_t)$, $Lsp=-0.866L_t+0.5R_t$, and $Rsp=-0.5L_t+0.866R_t$.

The sound image decoder 730 decodes the sound image information of the inaudible frequency domain, which is divided by the signal dividing unit 710. Here, the sound image information is the location and intensity of the virtual sound source. For instance, the sound image decoder 730 extracts information on the position and intensity of the corresponding virtual sound source from the component and amplitude of a particular frequency in the inaudible frequency domain.

The channel power enhancer 740 redistributes powers of multi channel signals, which have been decoded by the passive matrix decoder 720, based on the amplitude of the signals and the sound image information of each of the channels.

Figure 8:
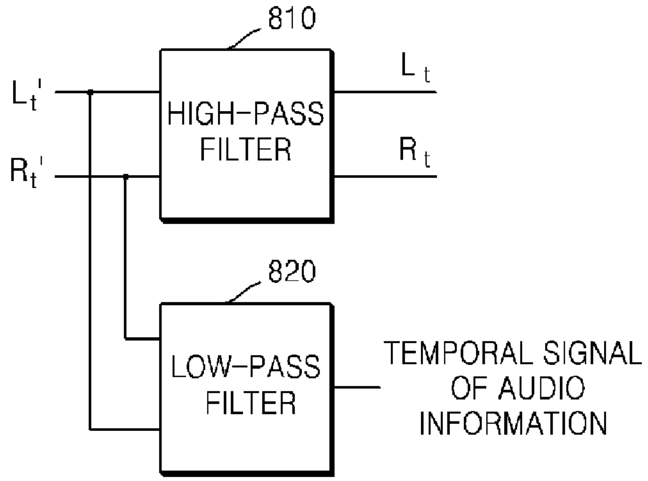
FIG. 8 illustrates an embodiment of the signal dividing unit in FIG. 7.

FIG. 8 illustrates an embodiment of the signal dividing unit 710 in FIG. 7. A high-pass filter 810 extracts the matrix-encoded stereo signals Lt and Rt by high-pass filtering the stereo channel audio signals $L_t'$ and $R_t'$.

A low-pass filter 820 extracts the temporal signal including the sound image information by low-pass filtering the stereo audio signals $L_t'$ and $R_t'$.

Figure 9:
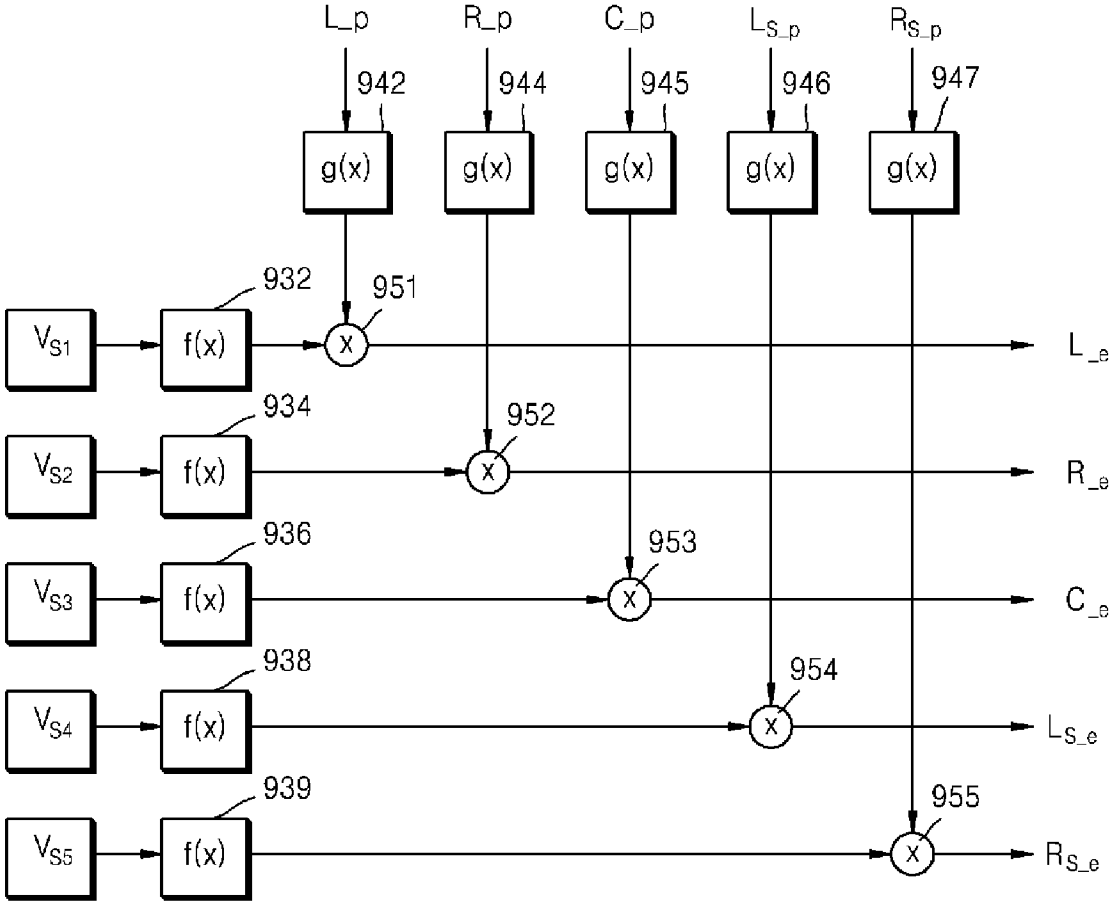
FIG. 9 illustrates an embodiment of the channel power enhancer in FIG. 7.

FIG. 9 illustrates an embodiment of the channel power enhancer 740 in FIG. 7. A first multiplier 951, a second multiplier 952, a third multiplier 953, a fourth multiplier 954, and a fifth multiplier 955, respectively, outputs reallocated signals L_e, R_e, C_e, Ls_e, and Rs_e of channels by multiplying disposition functions f(x) 932, 934, 936, 938, and 939, which, respectively have virtual sound source vectors vs1, vs2, vs3, vs4, and vs5, by gain control functions g(x) 941, 944, 945, 946, and 947 which, respectively, have the signal amplitudes L_p, R_p, C_p, Ls_p, and Rs_p of the decoded channels.

The gain control functions g(x) adjust the amplitude of each channel signal according to the ratio of the amplitude of the entire channel signal to the amplitude of each channel signal by comparing the amplitude of the decoded entire channel signal with the amplitude of each channel signal. For example, when the amplitude R_p of the right channel signal is more than 20% of the amplitude $L\_p^2+R\_P^2+C\_p^2+Ls\_P^2+Rs\_p^2$ of the entire channel signal, the amplitude R_p of the right channel is increased in proportion to the algebraic function. When the amplitude R_p of the right channel is less than 20% of the amplitude $L\_p^2+R\_P^2+C\_p^2+Ls\_P^2+Rs\_p^2$ of the entire channel signal, the amplitude R_p of the right channel is decreased in proportion to the algebraic function.

Figure 10:
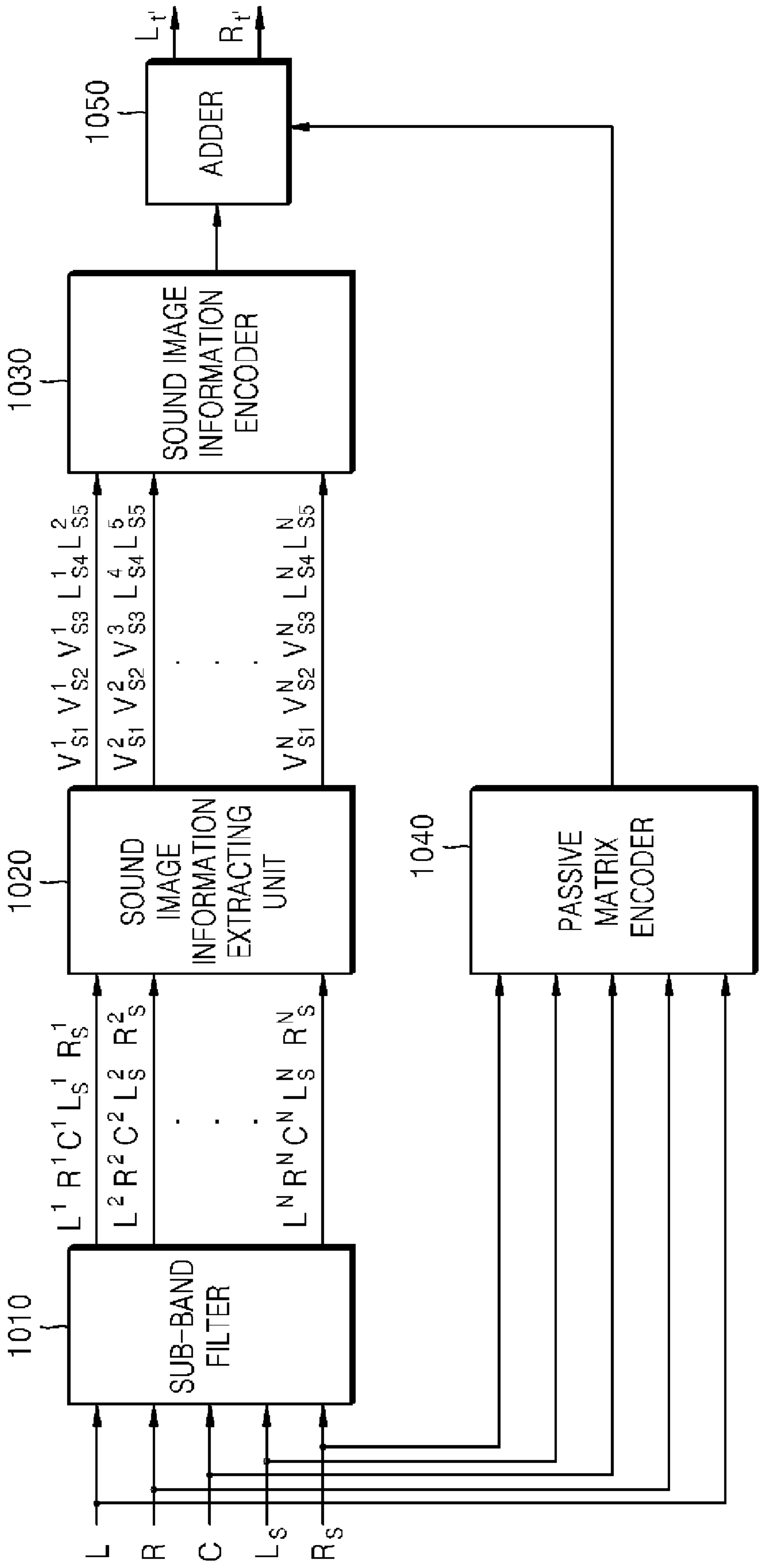
FIG. 10 is a block diagram illustrating an audio matrix encoding apparatus according to an embodiment of the present general inventive concept.

FIG. 10 is a block diagram illustrating an audio matrix encoding apparatus according to an embodiment of the present general inventive concept. Referring to FIG. 10, the audio matrix encoding apparatus includes a sub-band filter 1010, a sound image information extracting unit 1020, a sound image information encoder 1030, a passive matrix encoder 1040, and an adder 1050.

The sub-band filter 1010 divides a left channel signal L, a center channel signal C, a right channel signal R, a left surround channel signal Ls, and a right surround channel signal Rs into n number of the sub-bands. Thus, the signals of a plurality channels are divided into the sub-band multi signals $L^1R^1C^1Ls^1Rs^1, \ldots, L^NR^NC^NLs^NRs^N$.

The sound image information extracting unit 1020 extracts sound image information $Vs_1{}^1Vs_2{}^1Vs_3{}^1Vs_4{}^1Vs_5{}^1, \ldots, Vs_1{}^NVs_2{}^NVs_3{}^NVs_4{}^NVs_5{}^N$ corresponding to the intensity and position value of the virtual sound source, which exists between every two adjacent channels, from each sub-band signals based on the amplitude of each sub-band multi channel signal extracted by the sub-band filter 1010.

The sound image information encoder 1030 encodes the sound image information of each sub-band extracted by the sound image information extracting unit 1020, and allocates the encoded sound image information to the inaudible frequency domain. The inaudible frequency domain may use a low frequency ranging from 0 to 20 Hz or a high frequency more than 20 KHz.

The passive matrix encoder 1040 encodes audio signals of a plurality of channels into audio signals $L_t$ and $R_t$ of two channels by performing the matrix process.

The adder 1050 adds the sound image information of each sub-band, which is encoded by the sound image information encoder 1030, and the two channel signals $L_t$ and $R_t$, which are encoded by the passive matrix encoder 1040.

That is, the adder 1050 outputs stereo signals $L_t'$ and $R_t'$, which are obtained by adding the stereo audio signals in the audible frequency domain and the sound image information for each sub-band in the inaudible frequency domain.

Figure 11:
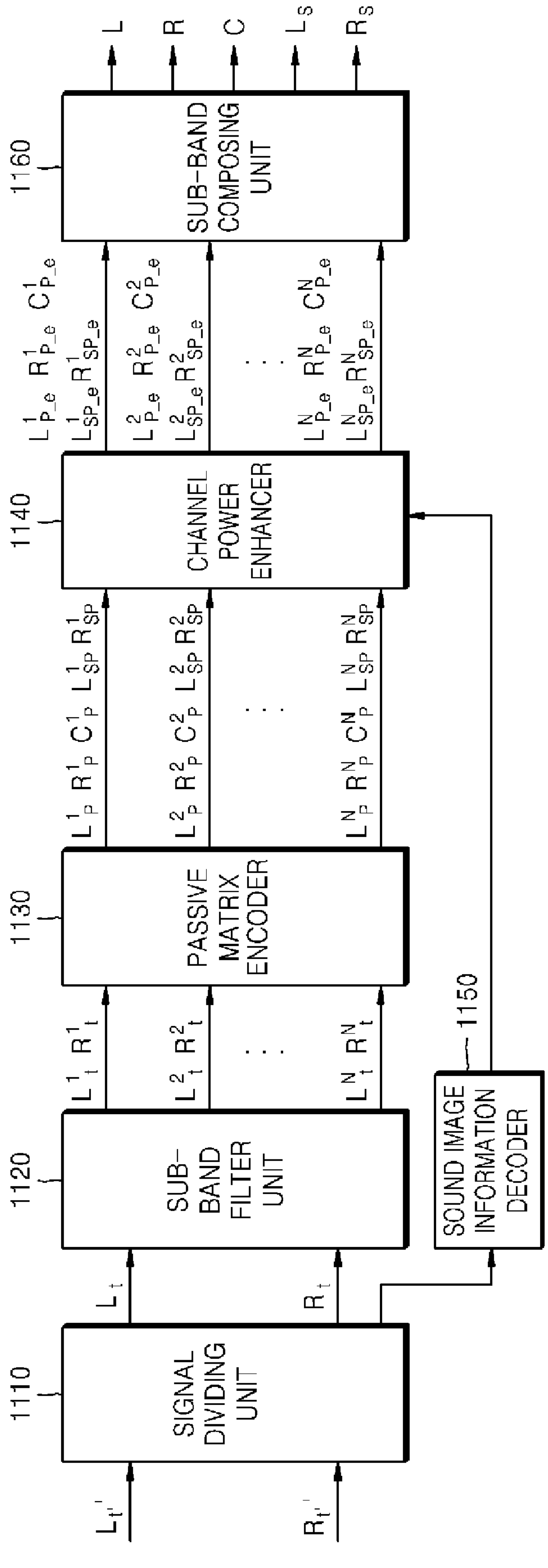
FIG. 11 is a block diagram illustrating an audio matrix decoding apparatus according to an embodiment of the present general inventive concept.

FIG. 11 is a block diagram illustrating an audio matrix decoding apparatus according to an embodiment of the present general inventive concept. Referring to FIG. 11, the audio matrix decoding apparatus includes a signal dividing unit 1110, a sub-band filter 1120, a passive matrix decoder 1130, a sound image information decoder 1150, a channel power enhancer 1140, and a sub-band composing unit 1160.

Initially, stereo audio signals $L_t'$ and $R_t'$, which include sound image information for each sub-band, is input to the audio matrix decoding apparatus.

The signal dividing unit 1110 filters the audio signals $L_t'$ and $R_t'$ of the stereo channels to divide the audio signals $L_t'$ and $R_t'$ into the inaudible frequency domain of the sound image information, which is encoded according to each sub-band, and the audible frequency domain of stereo signals $L_t$ and $R_t$, which are matrix-encoded.

The sub-band filter 1120 splits the stereo signals $L_t$ and $R_t$ into n number of sub-band signals by means of the linear combination between channels. Thus, the stereo signals Lt and $R_t$ are divided into sub-band stereo signals $L_t{}^1R_t{}^1, \ldots, L_t{}^NR_t{}^N$.

The passive matrix decoder 1130 decodes each of the sub-band stereo signals $L_t{}^1R_t{}^1, \ldots, L_t{}^NR_t{}^N$ into multi channel signals $L_p{}^1R_p{}^1C_p{}^1Ls_p{}^1Rs_p{}^1, \ldots, L_p{}^NR_p{}^NC_p{}^NLs_p{}^NRs_p{}^N$.

The sound image information decoder 1150 decodes the sound image information $Vs_1{}^1Vs_2{}^1Vs_3{}^1Vs_4{}^1Vs_5{}^1, \ldots, Vs_1{}^NVs_2{}^NVs_3{}^NVs_4{}^NVs_5{}^N$ from the inaudible frequency domain, which is divided by the signal dividing unit 1110, according to each sub-band.

The channel power enhancer 1140 redistributes the power of the sub-band signals of a plurality of channels, which are decoded by the passive matrix decoder 1130, based on the sub-band sound image information (the location and amplitude of each virtual sound source) of each channel, which is decoded by the sound image information decoder 1150, and the adjusted amplitude of each channel signal.

Hence, the channel power enhancer 1140 outputs signals $L^1{}_{p\_e}R^1{}_{p\_e}C^1{}_{p\_e}Ls^1{}_{p\_e}Rs^1{}_{p\_e}, \ldots, L^N{}_{p\_e}R^N{}_{p\_e}C^N{}_{p\_e}Ls^N{}_{p\_e}Rs^N{}_{p\_e}$ of which gains are redistributed according to each sub-band of multi channels.

The sub-band synthesizing unit 1160 synthesizes audio data of the multi channels, which are redistributed according to the sub-band, with one another to generate audio signals L, R, C, Ls, and Rs of multi channels.

Figure 12:
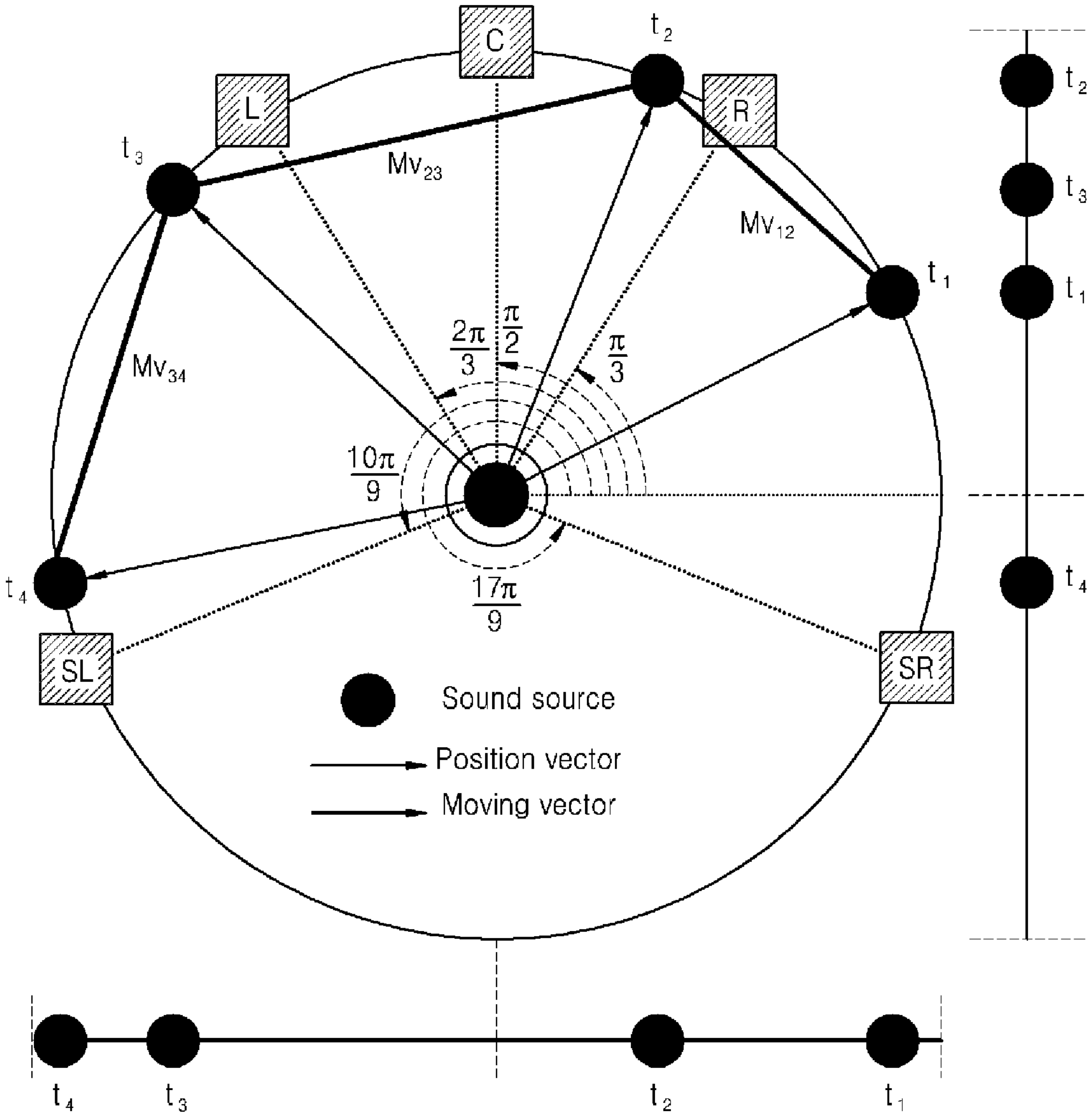
FIG. 12 illustrates reallocation of channels based on information on a location and an intensity of a virtual sound source, according to an embodiment of the present general inventive concept.

FIG. 12 illustrates redistribution of channels based on information on the position and intensity of a virtual sound source, according to an embodiment of the present general inventive concept. Referring to FIG. 12, when the virtual sound source is moved from a time point t1 to a time point t3, a moving vector, which indicates in what direction a sound image is moved, can be represented by $Mv_{12}$ and $Mv_{23}$. In this case, the sound image can be predicted to move along a same rotational direction as $Mv_{12}$ and $Mv_{23}$. Thus, the position of the sound source at a time point t4 can be close to a left surround channel SL. Such the change in the position of the virtual sound source usually occurs while multi channel audio signals, which have substantial movement of the sound image, are moving backwards. However, the conventional matrix decoding method only decodes the audio signals while assuming the sound image is moving between the front channels (for example, between the left and right channels). The present embodiment enables the sound image to move to the back channels (for example, to the left surround and right surround channels) by using the information of sound image movement, which is extracted from the inaudible frequency domain. Thus, even when the predicted location of the sound image is closer to the back channel, more accurate localization of a sound image can be obtained and channel separation can be increased by channel energy redistribution.

The general inventive concept can also be embodied as computer readable codes on a computer readable recording medium. The computer-readable medium can include a computer-readable recording medium and a computer-readable transmission medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, and optical data storage devices. The computer readable recording medium can also be distributed over network coupled computer systems so that the computer readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

According to various embodiments of the present general inventive concept, side information corresponding to a location and an intensity of a virtual sound source is allocated to a frequency domain other than an inaudible frequency domain, and thus movement of a sound image can be effectively restored and channel separation can be enhanced. Furthermore, sound sources of a plurality of channels are divided into sub-bands, so that the location and intensity of the virtual sound source with different frequency components can be encoded and decoded accurately.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims.

What is claimed is:

1. An audio matrix encoding method, comprising:

extracting pieces of sound image information comprising locations and intensities of virtual sound sources from audio signals of three or more multi channels, the location and the intensity of each virtual sound source being determined based on only two of the multi channels that are adjacent to a vector of the corresponding virtual sound source;

encoding the sound image information corresponding to the extracted locations and intensities of the virtual sound sources and allocating the encoded sound image information to an inaudible frequency domain, the locations and the intensities of the virtual sound sources being encoded into temporal signals with different amplitudes and frequency components in the inaudible frequency domain; and adding the encoded sound image information allocated to the inaudible frequency domain and matrix-encoded stereo signals of the audible frequency domain.

2. The audio matrix encoding method of claim 1, wherein, in the encoding of the sound image information, the sound image information is encoded into a component and an amplitude of a particular frequency in the inaudible frequency domain.

3. The audio matrix encoding method of claim 1, wherein, in the encoding of the sound image information, the location and intensity of a virtual sound source are mapped with a component and an amplitude of a frequency, respectively.

4. The audio matrix encoding method of claim 1, wherein, in the allocating of the encoded sound image information, the encoded sound image information is allocated to either a low frequency range or a high frequency range, which is included in the inaudible frequency domain.

5. The audio matrix encoding method of claim 1, wherein the extracting of the sound image information comprises:

extracting sub-band sound image information from the audio signals of the multi channels, which are sub-band divided.

6. An audio matrix decoding method, comprising:

separating encoded sound image information allocated to an inaudible frequency domain and stereo signals of an audible frequency domain from an audio signal, the encoded sound image information corresponding to locations and intensities of virtual sound sources that are encoded into temporal signals with different amplitudes and frequency components in the inaudible frequency domain;

decoding signals of three or more multi channels from the stereo signals of the audible frequency domain;

decoding the encoded sound image information from the inaudible frequency domain to extract the positions and the intensities of corresponding virtual sound sources from the sound image information, the position and the intensity of each virtual sound source being determined based on only two of the multi channels that are adjacent to a vector of the corresponding virtual sound source; and redistributing a power of a signal to a position of a speaker of each of the multi channel signals based on the decoded sound image information.

7. The audio matrix decoding method of claim 6, wherein, in the separating of the encoded sound image information and the stereo signals, the encoded sound image information is extracted by low-pass filtering the audio signal and the stereo signals are extracted by high-pass filtering the audio signal.

8. The audio matrix decoding method of claim 6, further comprising:

dividing the stereo signals into sub-bands and decoding the sub-band stereo signals into sub-band multi channel signals; and redistributing a power of a signal to the position of a speaker of each sub-band multi channel signal based on sub-band sound image information.

9. The audio matrix decoding method of claim 6, wherein, in the decoding of the encoded sound image information, the position and intensity of a corresponding virtual sound source are extracted from a component and an amplitude of a particular frequency in the inaudible frequency domain, respectively.

10. The audio matrix decoding method of claim 6, wherein the redistributing of the power of the signal comprises:

adjusting an amplitude of each channel signal according to a ratio of the amplitude of an entire channel signal to the amplitude of each channel signal by comparing an amplitude of the decoded entire signal with the amplitude of the each channel signal.

11. An audio matrix encoding and decoding method, comprising:

audio-encoding by extracting sound image information comprising locations and intensities of a virtual sound sources from audio signals of three or more multi channels, encoding the sound image information corresponding to the extracted locations and intensities of the virtual sound sources, allocating the encoded sound image information to an inaudible frequency domain and adding the encoded sound image information and encoded stereo signals, the locations and the intensities of the virtual sound sources being encoded into temporal signals with different amplitudes and frequency components in the inaudible frequency domain, the location and the intensity of each virtual sound source being determined based on only two of the multi channels that are adjacent to a vector of the corresponding virtual sound source; and audio-decoding by separating the encoded sound image information of the inaudible frequency domain and the stereo signals of an audible frequency domain from the audio-encoded stereo signals and redistributing a power to a position of a speaker of the each signal of the multi channels based on the encoded sound image information of the inaudible frequency domain.

12. An audio matrix encoding apparatus comprising:

a processor;

a memory containing a computer executable program which, when executed by the processor, performs operations of:

extracting, by a sound image information extracting unit, pieces of sound image information corresponding to intensities and positions of individual virtual sound sources, which exists between every two adjacent channels, based on power vectors of audio signals of three or more channels, the intensity and the position of each of the individual virtual sound sources being determined based on only corresponding two adjacent channels of the three or more channels, each of the individual virtual sound sources having a vector adjacent to the corresponding two adjacent channels;

encoding, by a sound image information encoder, the sound image information extracted by the sound image extracting unit and corresponding to the extracted location and intensity of the virtual sound source and allocating the encoded sound image information to an inaudible frequency domain, the positions and the intensities of the virtual sound sources being encoded into temporal signals with different amplitudes and frequency components in the inaudible frequency domain;

encoding, by a passive matrix encoder, the audio signals of the three or more channels into signals of stereo channels by performing a matrix process; and adding, by an adder, the encoded sound image information, which is encoded by the sound image information encoder, and the audio signals of two channels, which are encoded by the passive matrix encoder.

13. The audio matrix encoding apparatus of claim 12, wherein the sound image information extracting unit comprises:

a channel power vector extracting unit to extract power vectors of three or more channels by multiplying each amplitude of each multi channel signals by a position value of each speaker in polar coordinates; and a virtual sound source power vector estimating unit to estimate virtual sound source vectors, each of which exists between every two adjacent channels, based on the power vectors of individual channels, which are extracted by the channel power vector extracting unit.

14. The audio matrix encoding apparatus of claim 12, further comprising:

a sub-band filter to divide the audio signals of the multi channels into sub-bands.

15. An audio matrix decoding apparatus, comprising:

a processor;

a memory containing a computer executable program which, when executed by the processor, performs operations of:

dividing, by a signal dividing unit, stereo channel signals into an inaudible frequency domain to which encoded sound image information is allocated and an audible frequency domain by filtering the stereo channel signals, the encoded sound image information corresponding to locations and intensities of virtual sound sources that are encoded into temporal signals with different amplitudes and frequency components in the inaudible frequency domain;

decoding, by a passive matrix decoder, the stereo signals of the audible frequency domain, which is divided by the signal dividing unit, into signals of three or more channels;

decoding, by a sound image information decoder, the encoded sound image information comprising the locations and the intensities of the virtual sound sources from the inaudible frequency domain, which is divided by the signal dividing unit, the location and the intensity of each virtual sound source being determined based on only two of the three or more channels that are adjacent to a vector of the corresponding virtual sound source; and redistributing, by a channel power enhancer, a power of each signal of the three or more channels, which is decoded by the passive matrix decoder, based on the sound image information decoded by the sound image information decoder.

16. The audio matrix decoding apparatus of claim 15, wherein the signal dividing unit includes a high-pass filter to extract matrix-encoded stereo signals by high-pass filtering the stereo channel signals, and a low-pass filter to extract the encoded sound image information by low-pass filtering the stereo channel signals.

17. The audio matrix decoding apparatus of claim 15, further comprising:

a sub-band filter to split the stereo channel signals, which are divided by the signal dividing unit, according to sub-bands; and a sub-band synthesizing unit to generate audio signals of multi channels by sub-band synthesizing audio data of multi channels, which are redistributed by the channel power enhancer according to the sub-bands.

18. An encoder apparatus, comprising:

a processor;

a memory containing a computer executable program which, when executed by the processor, performs operations of:

encoding, by an audio encoder, audio signals of three or more multi channels into an audio signal of one or more channels, encoding sound image information comprising locations and intensities of virtual sound sources, and allocating the encoded sound image information comprising the locations and the intensities of the virtual sound sources within an audible frequency domain to an inaudible frequency domain as side information such that movement of a sound image is determined from the encoded sound image information allocated to the inaudible frequency and channel separation is increased, the locations and the intensities of virtual sound sources being encoded into temporal signals with different amplitudes and frequency components in the inaudible frequency domain, the location and the intensity of each virtual sound source being determined based on only two of the multi channels that are adjacent to a vector of the corresponding virtual sound source.

19. The apparatus of claim 18, wherein the side information corresponds to the locations and the intensities of the virtual sound sources allocated to a frequency domain other than the inaudible frequency domain.

20. The apparatus of claim 18, wherein the sound source is divided into a plurality of sub-bands.

21. An encoding method, comprising:

encoding audio signals of three or more multi channels into an audio signal of one or more channels;

encoding sound image information comprising locations and intensities of virtual sound sources; and allocating the encoded sound image information comprising the locations and the intensities of the virtual sound sources within an audible frequency domain to an inaudible frequency domain as side information such that movement of a sound image is determined from the encoded sound image information allocated to the inaudible frequency and channel separation is increased, the locations and the intensities of virtual sound sources being encoded into temporal signals with different amplitudes and frequency components in the inaudible frequency domain, the location and the intensity of each virtual sound source being determined based on only two of the multi channels that are adjacent to a vector of the corresponding virtual sound source.

22. A non-transitory computer-readable recording medium having embodied thereon a computer program to execute a method, wherein the method comprises:

encoding/decoding audio signals of three or more multi channels into an audio signal of one or more channels;

encoding sound image information comprising locations and intensities of virtual sound sources; and allocating the encoded sound image information comprising the locations and the intensities of the virtual sound sources within an audible frequency domain to an inaudible frequency domain as side information such that movement of a sound image is determined from the encoded sound image information allocated to the inaudible frequency and channel separation is increased, the locations and the intensities of virtual sound sources being encoded into temporal signals with different amplitudes and frequency components in the inaudible frequency domain, the location and the intensity of each virtual sound source being determined based on only two of the multi channels that are adjacent to a vector of the corresponding virtual sound source.

23. The audio matrix encoding method of claim 1, wherein the encoded sound image information is encoded into a spectral line in the inaudible frequency domain.

24. The audio matrix encoding method of claim 1, wherein the location and the intensity of the virtual sound source are determined based on power vectors of two channels located adjacent to the virtual sound source.

25. An audio encoding method, comprising:

calculating virtual sound source vectors based on power vectors of three or more audio channels, each of the virtual sound source vectors being calculated based on only corresponding two adjacent power vectors, each of the individual virtual sound sources having a vector adjacent to the corresponding two adjacent channels;

determining sound image information including intensities and positions of the virtual sound sources based on the respective virtual sound source vectors;

encoding the sound image information corresponding to the determined locations and intensities of the virtual sound sources, and allocating the encoded sound image information to an inaudible frequency domain, the positions and the intensities of virtual sound sources being encoded into temporal signals with different amplitudes and frequency components in the inaudible frequency domain;

encoding audio signals of the three or more audio channels into audio signals of two channels by performing a matrix process, and allocating the audio signals of two channels to an audible frequency domain; and adding the encoded sound image information in the inaudible frequency domain and the audio signals of two channels in the audible frequency domain.

* * * * *